(12) United States Patent
Hammond et al.

(10) Patent No.: US 12,160,969 B1
(45) Date of Patent: Dec. 3, 2024

(54) ADJUSTABLE CARD SUPPORT

(71) Applicant: ZT Group Int'l, Inc., Secaucus, NJ (US)

(72) Inventors: Mark Alan Hammond, Secaucus, NJ (US); Vladimir Igor Lipnevici, Secaucus, NJ (US); Michael Dennis Marcade, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 393 days.

(21) Appl. No.: 17/574,002

(22) Filed: Jan. 12, 2022

(51) Int. Cl.
*H05K 7/14* (2006.01)

(52) U.S. Cl.
CPC ................... *H05K 7/1424* (2013.01)

(58) Field of Classification Search
CPC .. H05K 7/1421; H05K 7/1422; H05K 7/1424; H05K 7/1425; H05K 7/1427; H05K 7/1428; H05K 7/1429; H05K 7/1431; H05K 7/1432; H05K 7/1461; H05K 7/1474; H05K 7/1485; H05K 7/1487; H05K 7/1488; H05K 7/1489; H05K 7/1495; H05K 7/18; H05K 7/183; H05K 7/186
USPC .......................................... 211/41.12
See application file for complete search history.

(56) References Cited

U.S. PATENT DOCUMENTS

| | | | | |
|---|---|---|---|---|
| 7,525,809 | B2 * | 4/2009 | Bergmann | H02J 13/0005 361/752 |
| 8,274,782 | B2 * | 9/2012 | Blodorn | H05K 7/1484 702/65 |
| 8,902,602 | B2 * | 12/2014 | Wang | H05K 7/1461 361/737 |
| 11,790,954 | B1 * | 10/2023 | Harlan | H05K 5/0208 361/679.33 |
| 2006/0063434 | A1 * | 3/2006 | Bergmann | H05K 7/1432 439/638 |
| 2022/0061181 | A1 * | 2/2022 | Baldwin, Jr. | G06F 1/185 |
| 2022/0087044 | A1 * | 3/2022 | Tan | H05K 7/1424 |

* cited by examiner

*Primary Examiner* — Joshua E Rodden
(74) *Attorney, Agent, or Firm* — Dergosits & Noah LLP; Todd A. Noah

(57) ABSTRACT

A card support is provided that passively and automatically adapts to variations in the length of an electronic card. When a card is inserted into a slotted bar of the card support, variations in the length of that card are adjusted for by the compression or expansion of a spring disposed between the slot and a supporting face.

19 Claims, 5 Drawing Sheets

ADJUSTABLE CARD SUPPORT

BACKGROUND

Typical card supports are adapted for electronic cards with standard lengths and, as a result, the supports have fixed locations. However, there can be discrepancies in the length of the electronic cards, e.g., PCI cards, due to tolerances and other factors, despite a manufacturer's efforts to adhere to a specification. In additional, factors outside the card manufacturer's control may contribute to a card mis-fit, such as the chassis not being perfectly square.

Existing card supports may be manually adjusted in fixed increments to fit different standard card lengths. However, variation in a card length may result in that card not being properly supported by a support positioned at any of the fixed increments. For example, if a fixed support may be moved manually in a intervals of 2 mm, such that the support may only be set at 98 mm, 100 mm, and 102 mm, and a card's nominal length is 100 mm+/−2 mm, and the support is set to 100, a card measuring 98 mm or 102 mm will either be squeezed too tightly or will not be supported at all, despite being within the specified length.

Thus, what is needed is a card support apparatus that adapts to variations in the lengths of multiple PCI cards from different manufacturers.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a card support that automatically adjusts to the variations in electronic card length. In embodiment, a spring-loaded support automatically adjusts to provide support for cards with different lengths. Thus, embodiments provide superior support compared to fixed supports, which cannot adapt to changes in card length. By adapting to changes in card length, embodiments fit to cards with dimensions that may be outliers to the extent that the card may not fit properly within and be properly supported by a fixed card support. In embodiments, a support with a spring-loaded end slot adapts to variations in card length. A feature of an embodiment is that the card may be oriented horizontally and the card support supports the card against the force of gravity while adapting to changes in the card's horizontal dimension. An embodiment may also adapt to variations in a card's length where the card is oriented vertically.

Regarding the card of the previous example with a nominal length of 100 mm+/−2 mm, a card measuring 98 mm or 102 mm will, an embodiment of a card support may use a spring to automatically and passively self-adjust so that the support adapts to the dimension of the card. Thus, the embodiment of the card support accommodates cards of the nominal length, including all of the tolerance range. For the nominal card length of this example, the location of the spring support at half compression would be at nominal card length, and the spring range from half compression would be the tolerance range of the card, i.e., the spring would compress 2 mm and extend 2 mm from half compression location. Thus, cards at the extreme ends of the specified length would be properly supported and held within the card support.

Figure 1:
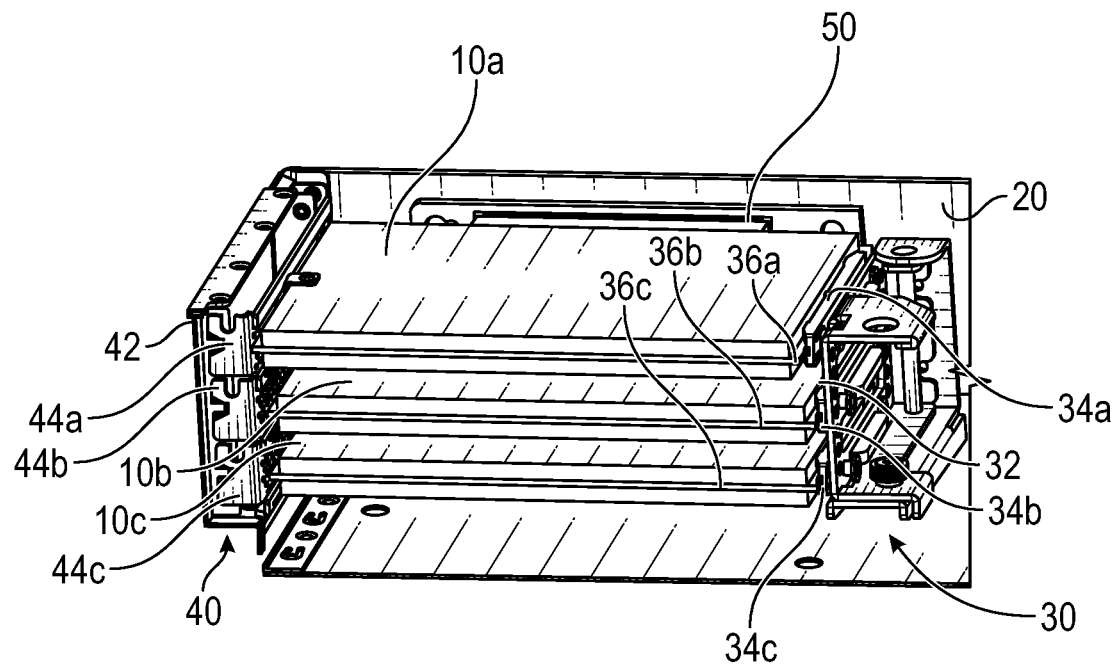
FIG. 1 is a perspective view of an embodiment of a card support populated with PCI cards.

FIG. 1 is a perspective view of an embodiment of a card support populated with PCI cards. In FIG. 1, an automatically, or self-adjusting card support 30 is populated with electronic cards 10a, 10b, 10c. As shown, cards 10a, 10b, 10c are PCI cards, but self-adjusting support 30 may be adapted to support other types of cards and cards of different dimensions. Self-adjusting support 30 is attached to a chassis 20. In chassis 20, cards 10a, 10b, 10c span between support 30 and are connected to a fixed support 40 at the other end of the card. Fixed support 40 includes a side face 42. Flanges 44a, 44b, 44c, of cards 10a, 10b, 10c, respectively, connect to and are supported by side face 42. Card 10a is connected to electrical connector 50. Cards 10b, 10c are connected to electrical connectors 52a, 52b (FIG. 2), respectively. Self-adjusting support 30 includes a slotted bar 34a, 34b, 34c connected to a support face 32.

FIG. 1 illustrates a card support adapted for three cards in a horizontal orientation, however embodiments may be adapted for any number of cards, and may be oriented differently. That is, as shown, adjusting support 30 supports cards 10a, 10b, 10c vertically against the force of gravity, and adjusts laterally to variations in card dimensions. However, an embodiment may be rotated so that cards 10a, 10b, 10c are supported by fixed support 40 as the base with adjusting support 30 adjusting to variations in card dimensions. Furthermore, an embodiment may be rotated with adjusting support 30 as both the base and adjusting to variations in card dimensions. In this disclosure, the discussion will often be directed to slotted bar 34a, but such discussion should be understood to apply equally to slotted bars 34b, 34c, as well, and vice versa. In FIG. 1, cards 10a, 10b, 10c are substantially parallel to each other and span between slotted bars 34a, 34b, 34c, and fixed support 40.

Figure 2:
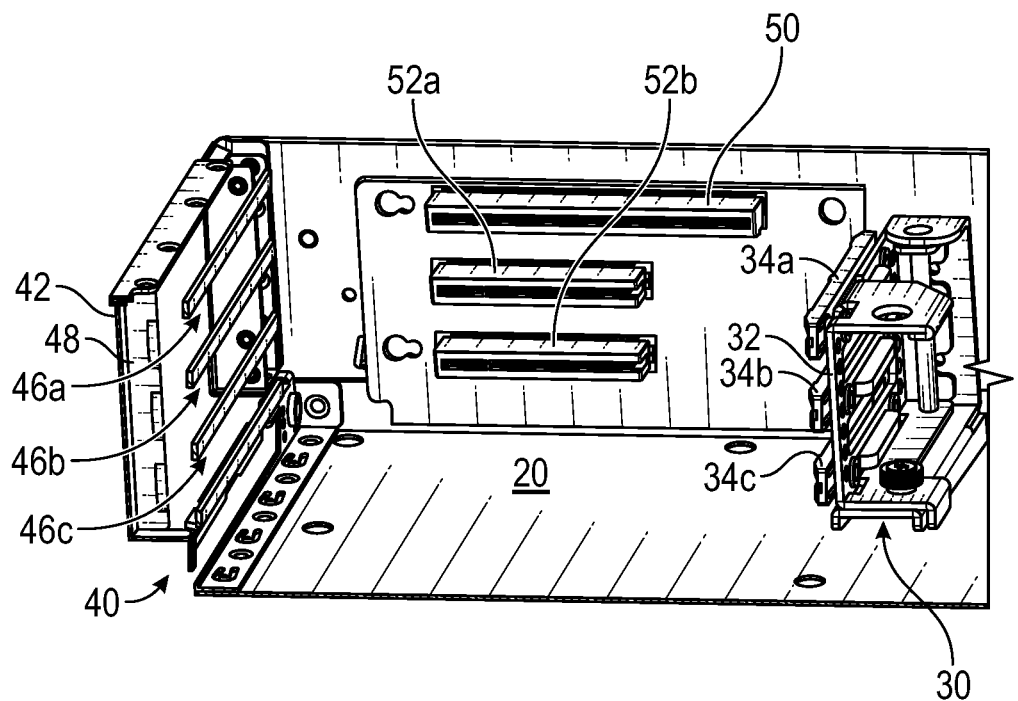
FIG. 2 is a perspective view of an embodiment of a card support.

FIG. 2 is a perspective view of card support 30. In FIG. 2, support 30 is unpopulated, illustrating the locations of connections 52a, 52b for cards 10b, 10c, respectively. FIG. 2 further illustrates that fixed support 40 is provided with fixed slots 46a, 46b, 46c. Cards 10a, 10b, 10c are slid into fixed slots 46a, 46b, 46c until flanges 44a, 44b, 44c are stopped by front face 48.

Figure 3:
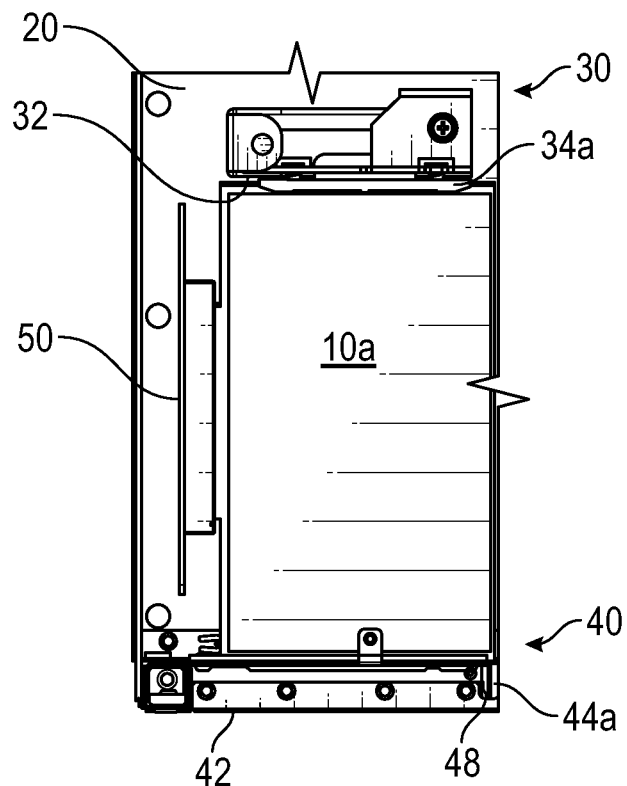
FIG. 3 is a top view of an embodiment of a card support populated with a PCI card.

FIG. 3 is a top view of an embodiment of a card support populated with a PCI card. In FIG. 3, card 10a is shown inserted into slotted bar 34a, connected to electrical connector 50, and inserted into fixed slot 46a, with flange 44a against face 48. FIG. 3 illustrates that, if card 10a varies in length, the variation may be accommodated by movement of slotting bar 34a with respect to support face 32. Similarly, slotted bars 34*b*, 34*c* may accommodate variations in length of cards 10*b*, 10*c*, respectively.

Figure 4:
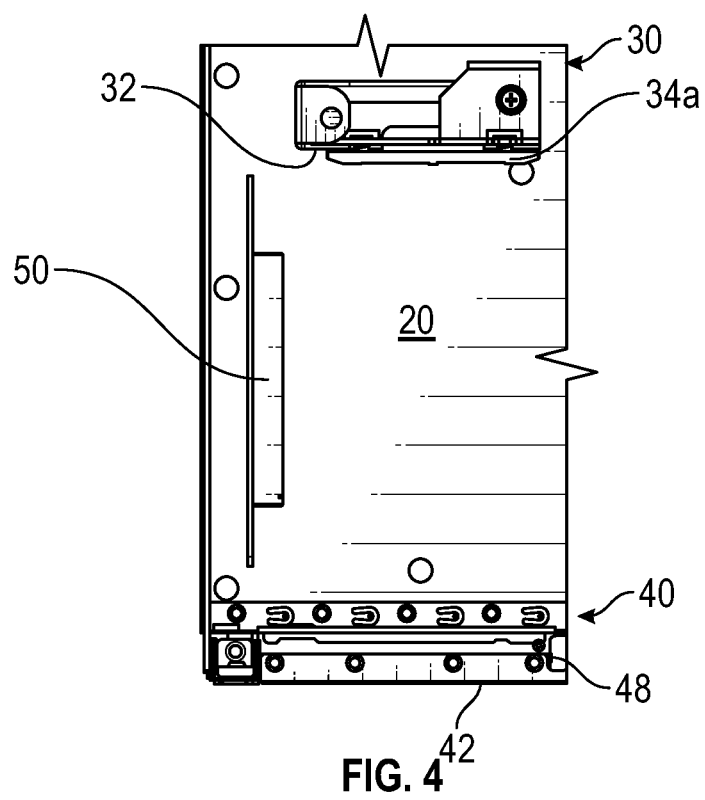
FIG. 4 is a top view of a populated embodiment of a card support.

FIG. 4 is a top view of card support 30 unpopulated. FIG. 4 illustrates that both card support 30 and fixed support 40 are fixed to the same panel of chassis 20. As shown, support A face 32 is substantially parallel to side face 42 of fixed support 40.

Figure 5:
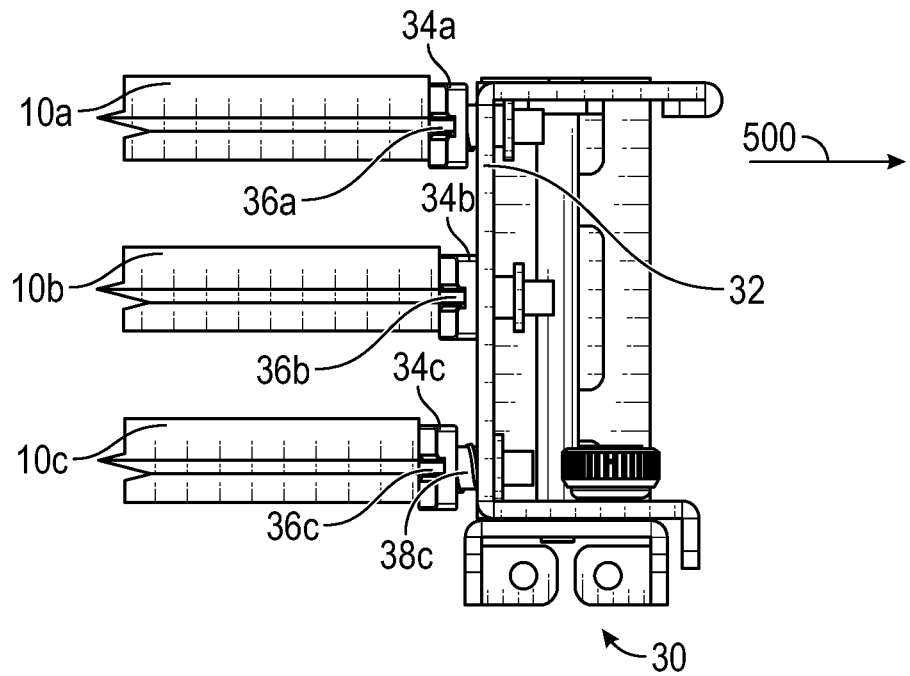
FIG. 5 is a side view of an embodiment of a card support populated with PCI cards.

FIG. 5 is a side view of an embodiment of a card support populated with PCI cards. In FIG. 5, self-adjusting support 30 is shown populated with cards of different length, illustrating the self-adjusting feature. Each card 10*a*, 10*b*, 10*c*, is shown to include a tab 36*a*, 36*b*, 36*c*, which is fully received by slotted bar 34*a*, 34*b*, 34*c*, respectively. Of the cards, card 10*b* is the longest, as illustrated by its extending further in direction 500. Card 10*a* is of intermediate length, and card 10*c* is the shortest. In accommodating these changes in length, slotted bars 34*a*, 34*b*, 34*c*, have automatically adjusted their distances from support face 32. As a result, slotted bar 34*b* is moved closest to face 32, slotted bar 34*c* extends furthest from face 32, and slotted bar 34*a* is somewhere in between. A spring 38*c* is shown between slotted bar 34*c* and support face 32. Slotted bars 34*a*, 34*b* are similarly fitted with springs 38*a*, 38*b* (FIG. 6), which are not shown in FIG. 5 due to the compressed positions of slotted bars 34*a*, 34*b*.

FIG. 5 illustrates that, because of the self-adjusting nature of slotted bars 34*a*, 34*b*, 34*c*, each slot 36*a*, 36*b*, 36*c* is fully inserted into their respective slotted bar, and therefore properly supported by that bar. In contrast, if a bar were fixed in place against face 32 (e.g., the position of bar 34*b* against face 32) and the card were short (e.g., such as card 36*c*), then the tab of that short card would not be fully inserted into and supported by the bar. Such incomplete insertion may be detrimental to the life of the card.

Applying card support to the card of the previous example with a nominal length of 100 mm+/−2 mm, a card measuring 98 mm or 102 mm. In FIG. 5, slotted support 34*a* represents the position for a card of nominal length (with the spring compressed approximately by half), slotted support 34*b* represents the position for a card of +2 mm (with the spring fully compressed or travel limited), and slotted support 34*c* represents the position for a card of −2 mm (with further extension being travel limited). Thus, the embodiment of the card support accommodates cards of the nominal length, including all of the tolerance range.

Figure 6:
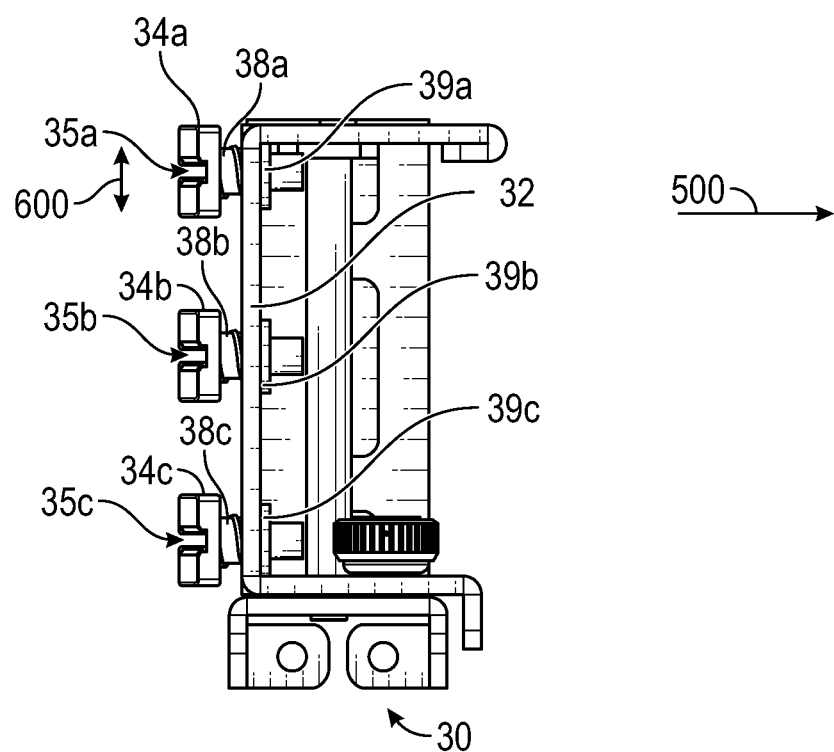
FIG. 6 is a side view of an embodiment of a card support.

FIG. 6 is a side view of an embodiment of a card support. In FIG. 6, card support 30 is unpopulated. Each slotted bar 34*a*, 34*b*, 34*c* is biased away from support face 32 by the force of a spring 38*a*, 38*b*, 38*c*, respectively. Each slotted bar 34*a*, 34*b*, 34*c*, is retained within support face 32 by a retaining head 39*a*, 39*b*, 39*c*, respectively, e.g., a head of a flat-head screw. FIG. 6 illustrates that, as oriented, slotted bars 34*a*, 34*b*, 34*c* adapt to changes in card length in direction 500 and support the car in a direction 600.

FIG. 6 further illustrates the range that a slotted bar may travel to adapt to variations in card length. As shown, slotted bars 34*a*, 34*b*, 34*c* are fully extended from face 32 and limited from further extension by heads 39*a*, 39*b*, 39*c*. Thus, slotted bars 34*a*, 34*b*, 34*c* are shown positioned to accommodate short cards, e.g., card 10*c* as shown in FIG. 5. However, for longer cards, such as cards 10*a*, 10*b* as shown in FIG. 5, the longer cards force slotting bars 34*a*, 34*b* in direction 500, compressing springs 38*a*, 38*b* until further travel in direction 500 is limited by either the full compression of the spring or contact between the slotted bar and face 32.

Furthermore, FIG. 6 illustrates that springs 38*a*, 38*b*, 38*c* undergo compression to adapt to the change in card length from a short card to a longer card. However, in embodiments springs may be disposed to undergo tension and bias slotted bars 34*a*, 34*b*, 34*c* to extend from face 32, e.g., a spring may be attached to face 32 and head 39*a* to force head 39*a* toward face 32. Similarly, in embodiments, leaf springs may replace the coil springs of the various figures.

Figure 7:
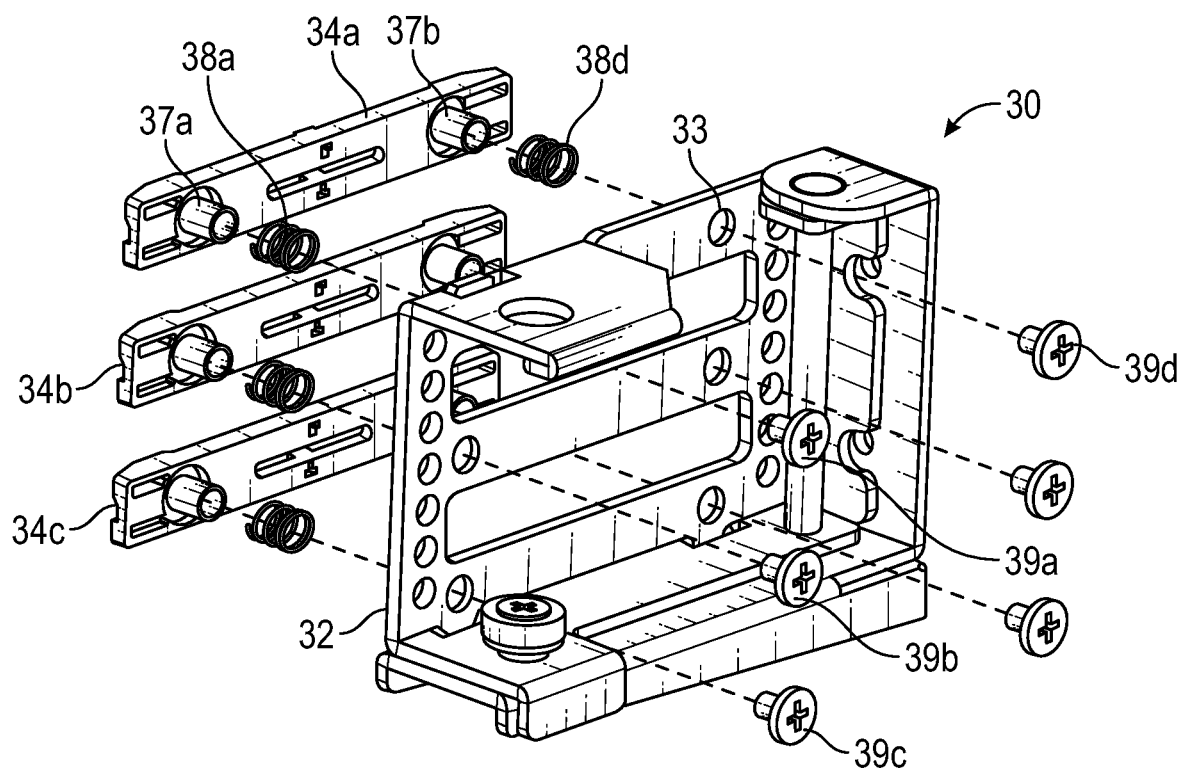
FIG. 7 is an assembly drawing of an embodiment of a card support.

FIG. 7 is an assembly drawing of an embodiment of a card support. In FIG. 7, slotting bar 34*a* is shown to include posts 37*a*, 37*b*, about which springs 38*a*, 38*d* are disposed. Each post passes through a hole in face 32 (e.g., 33 for fastener 39*d*) and connects to the respective head. Springs 38*a*, 38*d* bias slotted bar 34*a* away from face 32. Travel of slotting fitted 34*a* away from face 32 is thus limited by heads 39*a*, 39*d*. For example, head 39*d* may be a threaded fastener with threads (not shown) that engage threads (not shown) within post 37*b*. This discussion of slotted bar 34*a* applies equally to bars 34*b*, 34*c*. In FIG. 7 each slotted bar 34*a*, 34*b*, 34*c* is shown to include two posts and corresponding spring and fastener. However, one of skill will understand that additional, or fewer, posts may be included in embodiments. In addition, posts need not be cylindrical and may include posts with different cross-sections, e.g., square, rectangular, or oval cross-sections.

Figure 8:
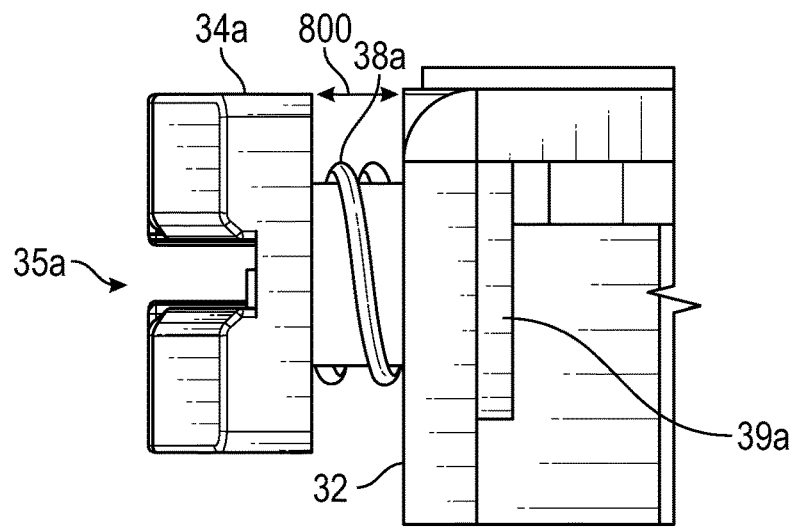
FIG. 8 is a side view of an aspect of an embodiment of a card support.

FIG. 8 is a side view of an aspect of an embodiment of a card support. In FIG. 8, a distance 800 indicates the distance that slotted fitted 34*a* may extend from support face 32 before being limited by fastener 39*a*.

Figure 9:
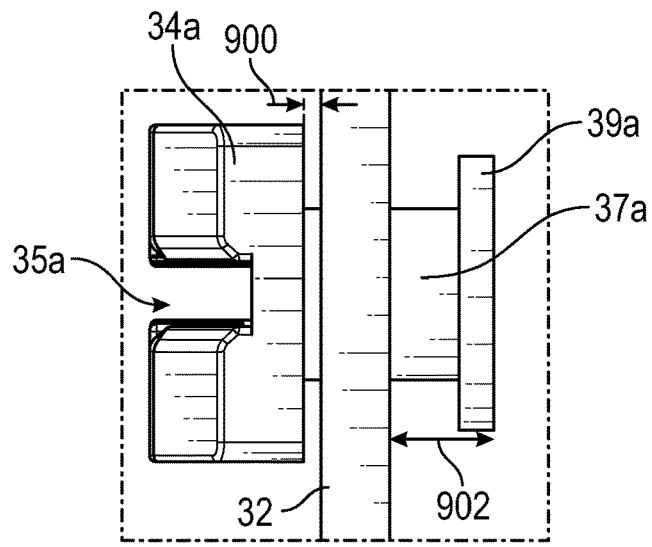
FIG. 9 is a side view of an aspect of an embodiment of a card support.

FIG. 9 is a side view of an aspect of an embodiment of a card support. In FIG. 9, a distance 900 indicates the distance that slotted bar 34*a* may be compressed before being limited by the full compression of spring 38*a* (not shown). Thus, the difference between distances 800 and 900 indicate the range of adjustability of this embodiment of slotted bar 34*a*. One of skill may configure the length of post 37*a* and the length and characteristics of spring 38*a* so that distance 900 is appropriate for the longest cards still within tolerances and distance 800 is appropriate for the shortest cards still within tolerances. A distance 902 indicates the distance that fastener 39*a* will extend from support face 32 when spring 38*a* is fully compressed. Movement of fastener 39*a* must be unobstructed for distance 902.

In an embodiment, face 32 may be adapted to include a recess (not shown) into which spring 38*a* may be compressed so that slotted bar 34*a* may fully bottom out on face 32, which would increase distance 902 accordingly.

Figure 10:
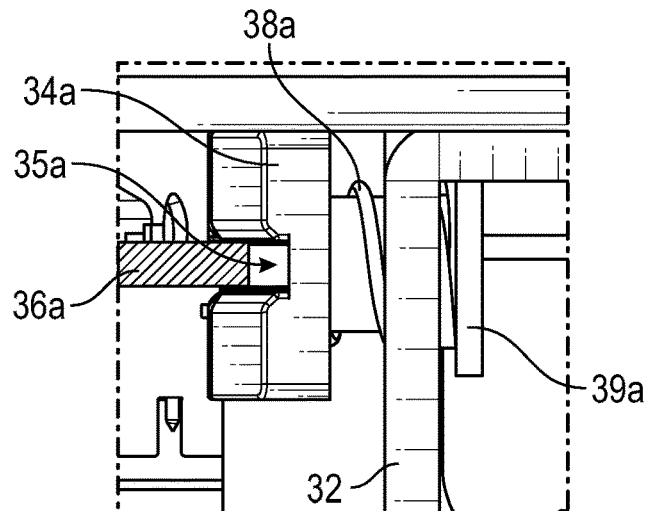
FIG. 10 is a side view of an aspect of an embodiment of a card support.

FIG. 10 is a side view of an aspect of an embodiment of a card support. In FIG. 10, tab 36*a* of card 10*a* is not fully inserted into slot 35*a*. FIG. 10 illustrates that tab 36*a* may not be fully inserted into slot 35*a* and yet slotted bar 34*a* will still support the tab against the forces of gravity.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
a face plate;
a first bar connected to the face plate and provided with a first slot configured to accept a first tab;
a second bar connected to the face plate and provided with a second slot configured to accept a second tab;
a first spring, wherein the first spring is disposed to bias the first bar away from the face plate and the first slot is provided on a side of the first bar away from the face plate such that movement of the first bar toward the face plate is against the bias of the first spring, and
a second spring, wherein the second spring is disposed to bias the second bar away from the face plate and the second slot is provided on a side of the second bar away from the face plate such that movement of the second bar toward the face plate is against the bias of the second spring.

2. The apparatus of claim 1, further including:
a first post extending from the first bar and through the face plate; and
a first head fixed to the first post at an end of the first post distal to the first bar, wherein:
movement of the first bar away from the face plate is limited by the first head.

3. The apparatus of claim 2, further including:
a second post extending from the first bar and through the face plate; and
a second head fixed to the second post at an end of the second post distal to the first bar, wherein:
movement of the first bar away from the face plate is limited by the first head and the second head.

4. The apparatus of claim 2, wherein the first spring is disposed about the first post between the first bar and the face plate.

5. The apparatus of claim 1, further including:
a chassis; and
a support connected to the chassis, wherein:
the face plate is connected to the chassis such that the first slot is at a first distance from the support, and
the face plate and support are capable of receiving a first card having a first length and including the first tab disposed between the support and the face plate with the first tab inserted into the first slot.

6. The apparatus of claim 5, wherein the first bar is capable of moving from a first extended position to a first retracted position against the bias of the first spring to accommodate a second card having a second length greater than the first length, the second card having the second tab configured to fit into the first slot.

7. The apparatus of claim 6, wherein a difference between the first extended position and the first retracted position corresponds to a tolerance range associated with the first card.

8. The apparatus of claim 5,
absent a force on the second spring, the second slot is at the first distance from the support; and wherein the face plate and support are capable of receiving the first card including the first tab disposed between the support and the face plate with the first tab inserted into the first slot and receiving a second card including the second tab disposed between the support and the face plate with the second tab inserted into the second slot.

9. The apparatus of claim 8, wherein:
the first bar is moveable from the first extended position to a first retracted position to accommodate the first card having a first length; and
the second bar is moveable from a second extended position to a second retracted position to accommodate the second card having a second length.

10. The apparatus of claim 9, wherein both the first bar and the second bar are capable of retracting to accommodate a tolerance range associated with the first card and the second card.

11. The apparatus of claim 8, wherein the orientation of the face plate and support on the chassis includes:
the face plate being perpendicular to a chassis panel;
the support being perpendicular to the chassis panel; and
the first bar and the second bar are connected to the face plate such that the first card and the second card are capable of being disposed between the support and the face plate such that the first card and the second card are parallel when disposed between the fixed support and the face plate.

12. A system comprising:
a chassis having a first support attached orthogonally to the chassis and a second support attached orthogonally to the chassis parallel to the first support at a distance from the first support;
a first bar movably connected to the first support and having a first slot on a side of the first bar opposite from the first support and facing the second support, the first bar being configured to move from an extended position to a compressed position by a first spring disposed between the first support and the first bar, the first spring being configured to bias the first bar away from the first support towards the second support when in the compressed position;
a second bar movably connected to the first support and having a second slot on a side of the second bar opposite from the first support and facing the second support, the second bar being configured to move from an extended position to a compressed position by a second spring disposed between the first support and the second bar, the second spring being configured to bias the second bar away from the first support towards the second support when in the compressed position;
a first electronic card having a first tab, the first bar being urged by the first spring into engagement with the first electronic card such that the first electronic card is disposed between the first bar and the second support and the first tab is received within the first slot; and a second electronic card having a second tab, the second bar being urged by the second spring into engagement with the second electronic card such that the second electronic card is disposed between the second bar and the second support and the second tab is received within the second slot.

13. The system of claim 12 further comprising a first post extending from the first bar and through the first support and a first head fixed to the first post at an end of the first post distal to the first bar, wherein movement of the first bar away from the first support is limited by the first head.

14. The system of claim 13 further comprising a second post extending from the first bar and through the first support and a second head fixed to the second post at an end of the second post distal to the first bar, wherein movement of the first bar away from the first support is limited by the first head and the second head.

15. The system of claim 13, wherein the first spring is disposed about the first post between the first bar and the first support.

16. The system of claim 12, wherein the first bar is capable of moving from the extended position to the compressed position against the bias of the first spring to accommodate a third electronic card having a third length greater than a first length of the first electronic card, the third electronic card having a third tab configured to fit within the first slot.

17. The system of claim 16, wherein a difference between the extended position and the compressed position corresponds to a tolerance range associated with the first card.

18. The system of claim 12, wherein the first electronic card has a first length and the second electronic card has a second length, the first length being one of greater than, lesser than or equal to the second length.

19. The system of claim 18, wherein both the first bar and the second bar are configured to move from the extended positions to the compressed positions to accommodate a tolerance range associated with the first card and the second card, respectively.

* * * * *